United States Patent
Yaung et al.

(10) Patent No.: US 9,761,629 B2
(45) Date of Patent: Sep. 12, 2017

(54) IMAGE SENSOR DEVICE AND METHOD

(71) Applicant: Taiwan Semiconductor Manufacturing Company, Ltd., Hsin-Chu (TW)

(72) Inventors: Dun-Nian Yaung, Taipei (TW); Feng-Chi Hung, Chu-Bei (TW); Jen-Cheng Liu, Hsin-Chu (TW); Jeng-Shyan Lin, Tainan (TW); Shuang-Ji Tsai, Tainan (TW)

(73) Assignee: Taiwan Semiconductor Manufacturing Company, Ltd., Hsin-chu (TW)

( * ) Notice: Subject to any disclaimer, the term of this patent is extended or adjusted under 35 U.S.C. 154(b) by 0 days.

(21) Appl. No.: 14/981,294

(22) Filed: Dec. 28, 2015

(65) Prior Publication Data
US 2016/0111464 A1  Apr. 21, 2016

Related U.S. Application Data

(62) Division of application No. 13/457,301, filed on Apr. 26, 2012, now Pat. No. 9,224,770.

(51) Int. Cl.
*H01L 27/146* (2006.01)

(52) U.S. Cl.
CPC .... *H01L 27/14685* (2013.01); *H01L 27/1464* (2013.01); *H01L 27/14609* (2013.01); *H01L 27/14621* (2013.01); *H01L 27/14629* (2013.01); *H01L 27/14689* (2013.01)

(58) Field of Classification Search
CPC .......... H01L 27/14621; H01L 27/1464; H01L 27/14629; H01L 27/14623; H01L 27/14645; H01L 27/14601
See application file for complete search history.

(56) References Cited

U.S. PATENT DOCUMENTS

| | | |
|---|---|---|
| 5,949,143 A | 9/1999 | Bang |
| 8,390,036 B2 | 3/2013 | Goto |
| 8,541,878 B2 | 9/2013 | Takahashi et al. |
| 2002/0153478 A1 | 10/2002 | Hsin |
| 2006/0138485 A1 | 6/2006 | Jung |
| 2006/0158547 A1 | 7/2006 | Komatsu et al. |
| 2009/0168181 A1 | 7/2009 | Su et al. |
| 2009/0200625 A1 | 8/2009 | Venezia et al. |

(Continued)

FOREIGN PATENT DOCUMENTS

| | | |
|---|---|---|
| JP | 10163462 A | 6/1998 |
| JP | 2006128433 A | 5/2006 |

(Continued)

*Primary Examiner* — Tucker J Wright
(74) *Attorney, Agent, or Firm* — Slater Matsil, LLP

(57) ABSTRACT

A system and method for reducing cross-talk between photosensitive diodes is provided. In an embodiment a first color filter is formed over a first photosensitive diode and a second color filter is formed over a second photosensitive diode, and a gap is formed between the first color filter and the second color filter. The gap will serve to reflect light that otherwise would have crossed from the first color filter to the second color filter, thereby reducing cross-talk between the first photosensitive diode and the second photosensitive diode. A reflective grid may also be formed between the first photosensitive diode and the second photosensitive diode in order to assist in the reflection and further reduce the amount of cross-talk.

20 Claims, 6 Drawing Sheets

(56) References Cited

U.S. PATENT DOCUMENTS

| | | |
|---|---|---|
| 2009/0294886 A1 | 12/2009 | Hsu et al. |
| 2009/0322923 A1 | 12/2009 | Maehara |
| 2010/0060769 A1 | 3/2010 | Inuiya |
| 2010/0140733 A1 | 6/2010 | Lee et al. |
| 2010/0176474 A1 | 7/2010 | Kwon et al. |
| 2010/0207225 A1 | 8/2010 | Masuda |
| 2010/0265384 A1 | 10/2010 | Tay et al. |
| 2011/0108938 A1 | 5/2011 | Nozaki et al. |
| 2011/0207250 A1 | 8/2011 | Uya |
| 2011/0291219 A1 | 12/2011 | Kwon |
| 2011/0298074 A1 | 12/2011 | Funao |
| 2012/0001286 A1 | 1/2012 | Yoon |
| 2012/0086094 A1 | 4/2012 | Watanabe |
| 2012/0261782 A1 | 10/2012 | Kobayashi et al. |
| 2012/0267744 A1 | 10/2012 | Tsuji |
| 2012/0280348 A1 | 11/2012 | Chou et al. |
| 2013/0307104 A1 | 11/2013 | Tsai et al. |

FOREIGN PATENT DOCUMENTS

| | | |
|---|---|---|
| JP | 2006295125 A | 10/2006 |
| JP | 2010258157 A | 11/2010 |
| JP | 2011054741 A | 3/2011 |
| JP | 2011054746 A | 3/2011 |
| JP | 2011134788 A | 7/2011 |
| JP | 2011204915 A | 10/2011 |
| JP | 2011258728 A | 12/2011 |
| JP | 2013229446 A | 11/2013 |
| KR | 1020100035439 A | 4/2010 |
| KR | 1020100083625 A | 7/2010 |
| WO | 2011077695 A1 | 6/2011 |

IMAGE SENSOR DEVICE AND METHOD

This application is a divisional of U.S. patent application Ser. No. 13/457,301, filed on Apr. 26, 2012, and entitled "Image Sensor Device and Method," which application is hereby incorporated herein by reference.

BACKGROUND

Complementary metal oxide semiconductor image sensors generally utilize a series of photodiodes formed within an array of pixel regions of a semiconductor substrate in order to sense when light has impacted the photodiode. Adjacent to each of the photodiodes within each of the pixel regions a transfer transistor may be formed in order to transfer the signal generated by the sensed light within the photodiode at a desired time. Such photodiodes and transfer transistors allow for an image to be captured at a desired time by operating the transfer transistor at the desired time.

The complementary metal oxide semiconductor image sensors may generally be formed in either a front side illumination configuration or a back-side illumination configuration. In a front-side illumination configuration light passes to the photodiode from the "front" side of the image sensor where the transfer transistor has been formed. However, in this configuration the light is forced to pass through metal layers, dielectric layers, and past the transfer transistor before it reaches the photodiode. This may generate processing and/or operational issues as the metal layers, dielectric layers, and the transfer transistor may not necessarily be transparent and may block the light as it is trying to reach the photodiode.

In a back-side illumination configuration, the transfer transistor, the metal layers, and the dielectric layers are formed on a the front side of the substrate, and light is allowed to pass to the photodiode from the "back" side of the substrate such that the light hits the photodiode before it reaches the transfer transistor, the dielectric layers, or the metal layers. Such a configuration may reduce the complexity of the manufacturing of the image sensor and its operation.

However, pixel regions that are adjacent to each other may interfere with each other's operation in what is known as cross-talk. Such cross-talk can reduce the precision and efficiency of the image sensor.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the embodiments provide many applicable concepts that can be embodied in a wide variety of specific contexts. The specific embodiments discussed are merely illustrative of specific ways to make and use the embodiments, and do not limit the scope of the embodiments.

Embodiments will be described with respect to a specific context, namely a complementary metal oxide semiconductor (CMOS) back side illuminated image sensor. Other embodiments may also be applied, however, to other image sensors and other semiconductor devices.

Figure 1:
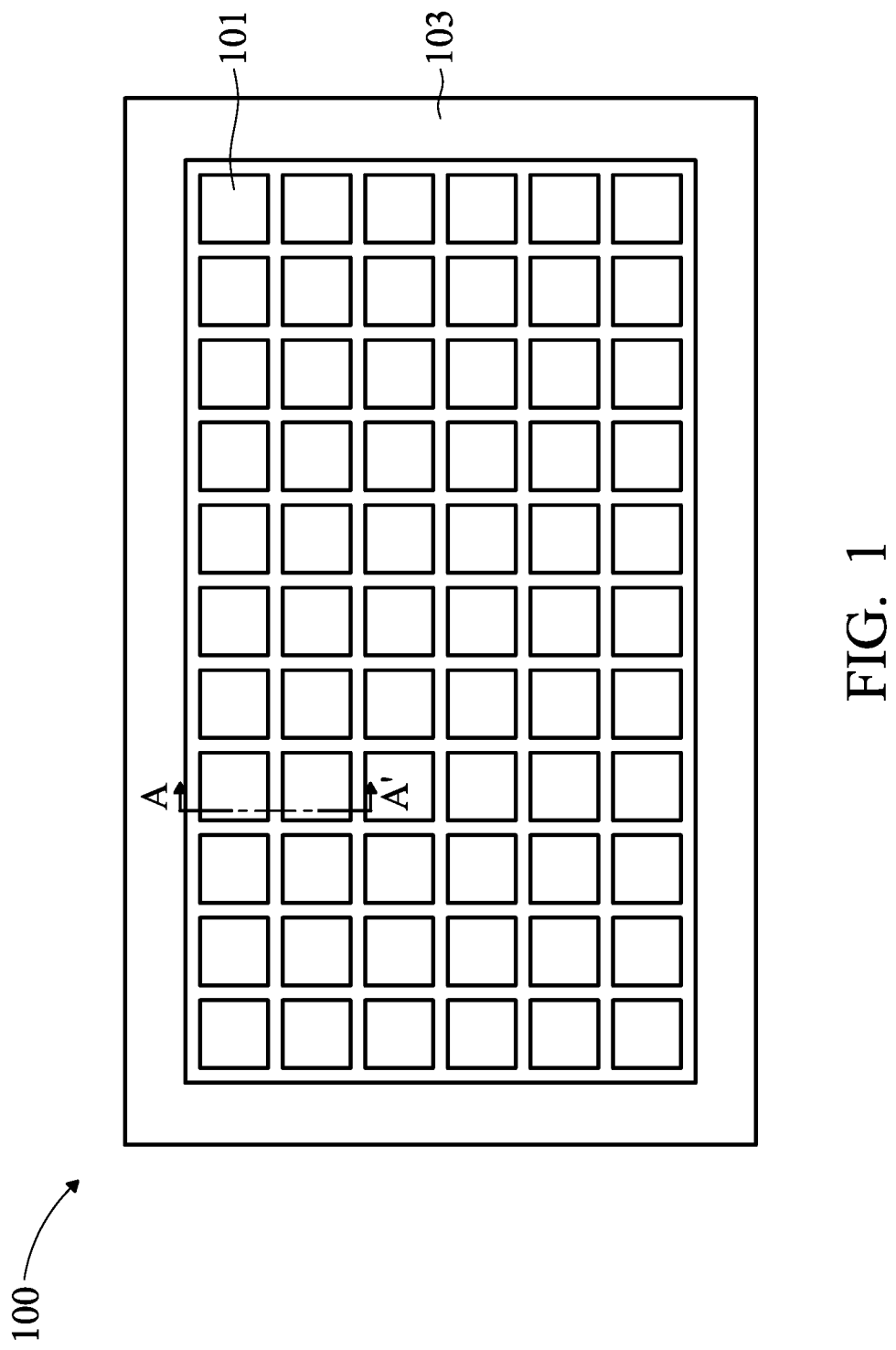
FIG. 1 illustrates an image sensor with an array of pixel regions in accordance with an embodiment.

With reference now to FIG. 1, there is shown an image sensor 100 which comprises a grid or array of backside illuminated pixel regions 101. The image sensor 100 also may comprise a logic region 103 located adjacent to the array of pixel regions 101. The logic region 103 may have additional circuitry and contacts for input and output connections to and from the array of pixel regions 101. The logic region 103 is utilized to provide an operating environment for the pixel regions 101 and to moderate communications between the array of pixel regions 101 and other external devices (not shown).

Figure 2:
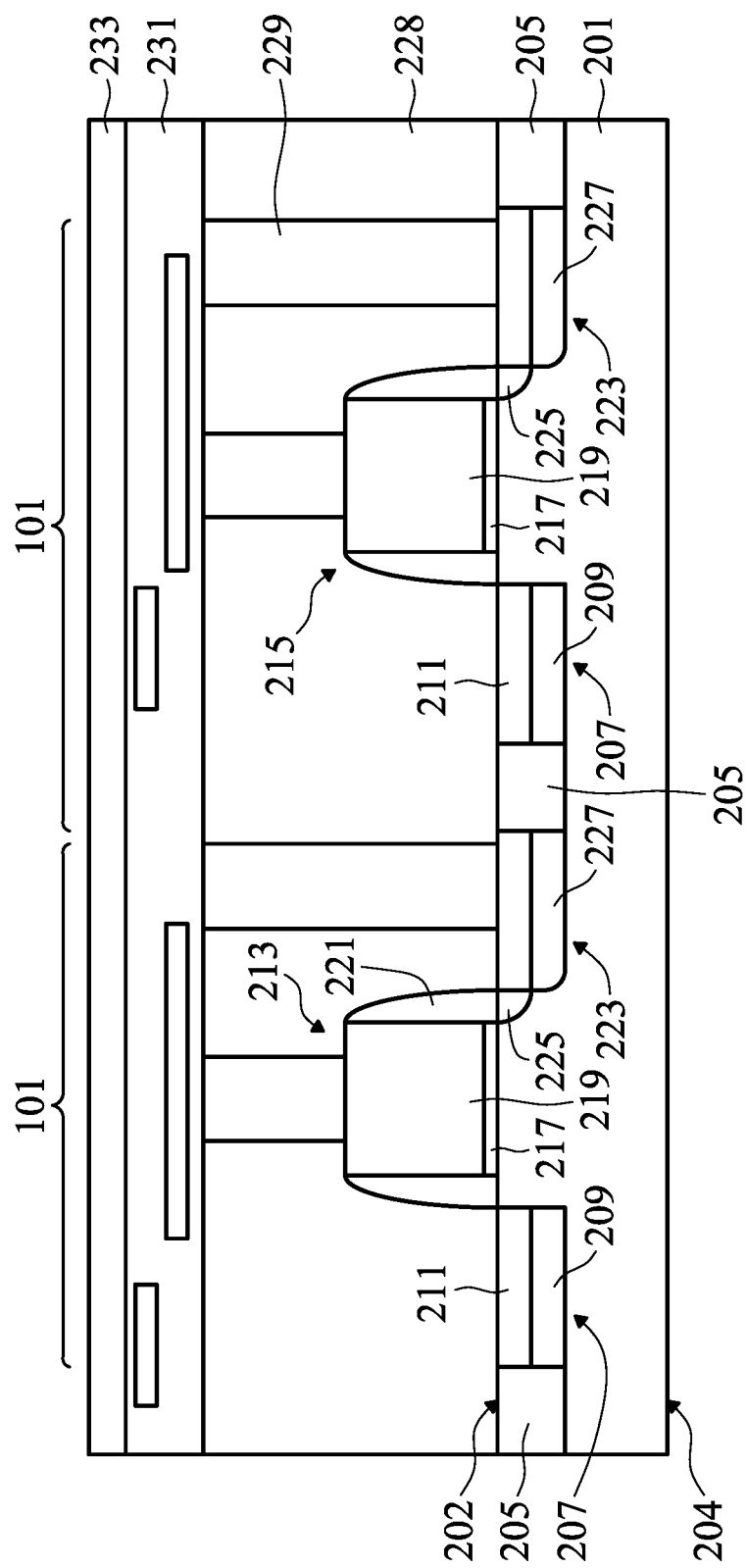
FIG. 2 illustrates a first photosensitive diode and a second photosensitive diode in a substrate in accordance with an embodiment.

FIG. 2 illustrates a simplified cross sectional view of adjacent pixel regions 101 through line A-A' in FIG. 1, and shows a substrate 201 with two pixel regions 101 separated by isolation regions 205. The substrate 201 may comprise a front side 202 and a back side 204 and may be a semiconductor material such as silicon, germanium, diamond, or the like, with a crystal orientation of (110). Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, with other crystal orientations, may also be used. Additionally, the substrate 201 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 201 may be doped with a p-type dopant, such as boron, gallium, although the substrate may alternatively be doped with an n-type dopant, as is known in the art.

The isolation regions 205 may be located within the substrate 201 between the individual pixel regions 101 in order to separate and isolate the pixel regions 101. The isolation regions 205 may be shallow trench isolations generally formed by etching the substrate 201 to form a trench and filling the trench with dielectric material as is known in the art. The isolation regions 205 may be filled with a dielectric material such as an oxide material, a high-density plasma (HDP) oxide, or the like, formed by conventional methods known in the art. Optionally, an oxide liner may be formed along the sidewalls of the isolation regions 205.

Photosensitive diodes 207 may be formed in respective pixel regions 101. The photosensitive diodes 207 may be utilized to generate a signal related to the intensity or brightness of light that impinges on the photosensitive diodes 207. In an embodiment the photosensitive diodes 207 may comprise n-type doped regions 209 formed in the substrate 201 (which in this embodiment may be a p-type substrate) and also may comprise heavily doped p-type doped regions 211 formed on the surface of the n-type doped regions 209 to form a p-n-p junction.

The n-type doped regions 209 may be formed, e.g., using a photolithographic masking and implantation process. For example, a first photoresist (not shown in FIG. 2) may be placed on the substrate 201. The first photoresist, may comprise a conventional photoresist material, such as a deep ultra-violet (DUV) photoresist, and may be deposited on the surface of the substrate 201, for example, by using a spin-on process to place the first photoresist. However, any other suitable material or method of forming or placing the first photoresist may alternatively be utilized. Once the first photoresist has been placed on the substrate 201, the first photoresist may be exposed to energy, e.g. light, through a patterned reticle in order to induce a reaction in those portions of the first photoresist exposed to the energy. The first photoresist may then be developed, and portions of the first photoresist may be removed, exposing a portion of the substrate 201 where the photosensitive diodes 207 are desired to be located.

Once the first photoresist has been placed and developed, the heavily doped n-type doped regions 209 may be formed by implanting n-type dopants (e.g., phosphorous, arsenic, antimony, or the like) through the first photoresist. In an embodiment the n-type doped regions 209 may be implanted such that their concentration of between about 1e15 atom/$cm^3$ and about 1e20 atom/$cm^3$, such as about 8e15 atom/$cm^3$. However, any suitable alternative concentration for the heavily doped n-type doped regions 209 may alternatively be utilized.

After the n-type doped regions 209 have been formed (e.g., through the implantation process), the p-type doped regions 211 may be formed using, e.g., an ion implantation process using the first photoresist as a mask. The p-type doped regions 211 may be formed to extend into the substrate 201 between about 1 µm and about 4 µm. Additionally, the p-type doped regions 211 may be formed to have a concentration of between about 1e15 atom/$cm^3$ and about 5e19 atom/$cm^3$, such as about 1e16 atom/$cm^3$.

Once the photosensitive diodes 207 have been formed, the first photoresist may be removed. In an embodiment, the first photoresist may be removed using a process such as ashing.

Further, as one of ordinary skill in the art will recognize, the photosensitive diodes 207 described above are merely one type of photosensitive diodes 207 that may be used in the embodiments. Any suitable photodiode may be utilized with the embodiments, and all of these photodiodes are intended to be included within the scope of the embodiments. Additionally, the precise methods or order of steps described above may be modified, such as by forming the p-type doped regions 211 prior to the formation of the n-type doped regions 209, while still remaining within the scope of the embodiments.

A first transistor 213 and a second transistor 215 may be formed in respective pixel regions 101 adjacent to their respective photosensitive diodes 207. The first transistor 213 and the second transistor 215 may be transfer transistors. However, the first transistor 213 and the second transistor 215 are also merely representative of the many types of functional transistors that may be utilized within the pixel regions 101. For example, while the first transistor 213 and the second transistor 215 are illustrated in FIG. 2 as transfer transistors, embodiments may additionally include other transistors located within the pixel regions 101, such as reset transistors, source follower transistors, or select transistors. These transistors may be arranged, for example, to form a four transistor CMOS image sensor (CIS). All suitable transistors and configurations that may be utilized in an image sensor are fully intended to be included within the scope of the embodiments.

The first transistor 213 and the second transistor 215 may comprise gate stacks that may be formed over the substrate 201. The gate stacks may each comprise a gate dielectric 217 and a gate electrode 219. The gate dielectrics 217 and gate electrodes 219 may be formed and patterned on the substrate 201 by any suitable process known in the art. The gate dielectrics 217 may be a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like. The gate dielectrics 217 may have a relative permittivity value greater than about 4.

In an embodiment in which the gate dielectrics 217 comprise an oxide layer, the gate dielectrics 217 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In one embodiment, the gate dielectrics 217 may be between about 10 Å to about 150 Å in thickness, such as 100 Å in thickness.

The gate electrodes 219 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon). In an embodiment in which the gate electrodes 219 is poly-silicon, the gate electrodes 219 may be formed by depositing doped or undoped poly-silicon by low-pressure chemical vapor deposition (LPCVD) to a thickness in the range of about 100 Å to about 2,500 Å, such as 1,200 Å.

Spacers 221 may be formed on the sidewalls of the gate dielectrics 217 and the gate electrodes 219. The spacers 221 may be formed by blanket depositing a spacer layer (not shown) on the previously formed structure. The spacer layer may comprise SiN, oxynitride, SiC, SiON, oxide, and the like, and may be formed by commonly used methods such as chemical vapor deposition (CVD), plasma enhanced CVD, sputter, and other methods known in the art. The spacer layer is then patterned to form the spacers 221, such as by anisotropically etching to remove the spacer layer from the horizontal surfaces of the structure.

Source/drain regions 223 may be formed in the substrate 201 on an opposing side of the gate dielectrics 217 from the photosensitive diodes 207. In an embodiment in which the substrate 201 is a p-type substrate, the source/drain regions 223 may be formed by implanting appropriate n-type dopants such as phosphorous, arsenic or antimony. The source/drain regions 223 may be implanted using the gate electrodes 219 and the spacers 221 as masks to form lightly doped source/drain (LDD) regions 225 and heavily doped source/drain regions 227.

It should be noted that one of ordinary skill in the art will realize that many other processes, steps, or the like may be used to form the source/drain regions 223 and the photosensitive diodes 207. For example, one of ordinary skill in the art will realize that a plurality of implants may be performed using various combinations of spacers and liners to form the source/drain regions 223 and the photosensitive diodes 207 having a specific shape or characteristic suitable for a particular purpose. Any of these processes may be used to form the source/drain regions 223 and the photosensitive diodes 207, and the above description is not meant to limit the embodiments to the steps presented above.

Once the first transistor 213 and the second transistor 215 have been formed, a first inter-layer dielectric (ILD) layer 228 may be formed over the pixel regions 101 and contacts 229 may be formed through the first ILD layer 228. The first ILD layer 228 may comprise a material such as boron phosphorous silicate glass (BPSG), although any suitable dielectrics may be used for either layer. The first ILD layer 228 may be formed using a process such as PECVD, although other processes, such as LPCVD, may alternatively be used. The first ILD layer 228 may be formed to a thickness of between about 100 Å and about 3,000 Å.

The contacts 229 may be formed through the first ILD layer 228 with suitable photolithography and etching techniques. In an embodiment a first photoresist material is utilized to create a patterned mask to define contacts 229. Additional masks, such as a hardmask, may also be used. An etching process, such as an anisotropic or isotropic etch process, is performed to etch the first ILD layer 228.

Contacts 229 may then be formed so as to contact the substrate 201 and the gate electrodes 219. The contacts 229 may comprise a barrier/adhesion layer (not individually shown in FIG. 2) to prevent diffusion and provide better adhesion for the contacts 229. In an embodiment, the barrier layer is formed of one or more layers of titanium, titanium nitride, tantalum, tantalum nitride, or the like. The barrier layer may be formed through chemical vapor deposition, although other techniques could alternatively be used. The barrier layer may be formed to a combined thickness of about 50 Å to about 500 Å.

The contacts 229 may be formed of any suitable conductive material, such as a highly-conductive, low-resistive metal, elemental metal, transition metal, or the like. In an exemplary embodiment the contacts 229 are formed of tungsten, although other materials, such as copper, could alternatively be utilized. In an embodiment in which the contacts 229 are formed of tungsten, the contacts 229 may be deposited by CVD techniques known in the art, although any method of formation could alternatively be used.

After the contacts 229 are formed, further processing of the front side 202 of the substrate 201 may be performed. This processing may comprise forming various conductive and dielectric layers (collectively referred to in FIG. 2 by the reference number 231) in order to form interconnections between the individually formed devices to each other. These interconnections may be made through any suitable formation process (e.g., lithography with etching, damascene, dual damascene, or the like) and may be formed using suitable conductive materials such as aluminum alloys, copper alloys, or the like.

Additionally, once the interconnections have been formed over the first ILD layer 228, a passivation layer 233 may be formed in order to protect the underlying layers from physical and chemical damage. The passivation layer 233 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer 233 may be formed through a process such as chemical vapor deposition (CVD), although any suitable process may be utilized.

Figure 3:
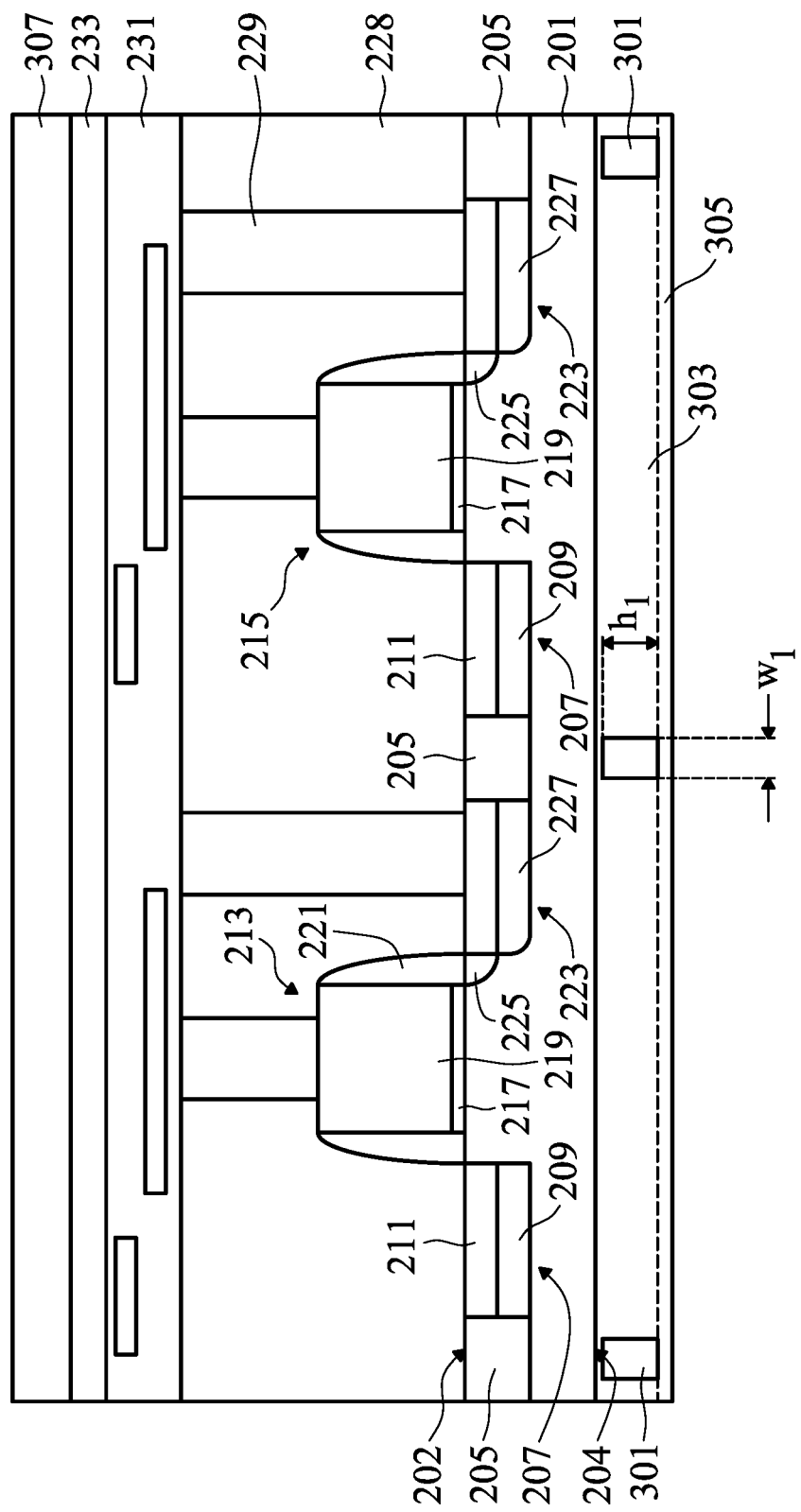
FIG. 3 illustrates a formation of a reflective grid over the substrate in accordance with an embodiment.

FIG. 3 illustrates a placement of the substrate 201 on a carrier wafer 307 and further processing on the back side 204 of the substrate 201 that may be performed after the processing on the front side 202 of the substrate 201. The carrier wafer 307 may be utilized to provide support and protection to the structures on the front side 202 of the substrate 201 while the back side 204 is further processed, and the carrier wafer 307 may comprise a material such as glass, silicon, glass ceramics, combinations of these, or the like. The substrate 201 may be attached to the carrier wafer 307 using, e.g., an adhesive (not individually illustrated in FIG. 3), although any suitable method of attaching the substrate 201 to the carrier wafer 307 may alternatively be utilized.

Alternatively, the substrate 201 may be wafer bonded to another wafer (not illustrated) instead of the carrier wafer 307. In this embodiment the substrate 201 may be physically and electrically connected through the conductive and dielectric layers 231 and the passivation layer 233 to another wafer in order to provide signals and/or power between the substrate 201 and the other wafer. This and any other method of protecting the front side 202 of the substrate 201 may alternatively be utilized, and all such methods are fully intended to be included within the scope of the embodiment.

Once the substrate 201 has been placed on the carrier wafer 307, the back side 204 of the substrate 201 may be processed further. In an embodiment the thickness of the back side 204 of the substrate 201 may reduced, or thinned. Thinning reduces the distance that light travels through the back side 204 of the substrate 201 before it reaches the photosensitive diodes 207. The thinning of the back side 204 of the substrate 201 may be performed using a removal process such as chemical mechanical polishing (CMP). In a CMP process, a combination of etching materials and abrading materials are put into contact with the back side 204 of the substrate 201 and a grinding pad (not shown) is used to grind away the back side 204 of the substrate 201 until a desired thickness is achieved. However, any suitable process for thinning the back side 204 of the substrate 201, such as etching or a combination of CMP and etching, may alternatively be used. The back side 204 of the substrate 201 may be thinned so that the substrate 201 has a thickness of between about 2 μm and about 2.3 μm.

FIG. 3 also illustrates the formation of a reflective grid 301 over the back side 204 (now thinned) of the substrate 201. In an embodiment the reflective grid 301 may be used to ensure that light has entered the image sensor 100 over one pixel region 101 does not cross into another pixel region 101 prior to impinging upon a photosensitive diode 207. As such, the reflective grid 301 may be formed between the individual pixel regions 101 over the isolation regions 205 in the image sensor 100.

In an embodiment the reflective grid 301 may be formed by initially forming a holding layer 303 to hold the reflective grid 301. In an embodiment the holding layer 303 may comprise a transparent material that will allow the passage of light through the holding layer 303, such as an oxide. For example, the holding layer 303 may be a material such as silicon oxide, although any other suitable material may alternatively be utilized. The holding layer 303 may be formed through a process such as CVD, PECVD, thermal oxidation or combinations of these. The holding layer 303 may be formed to a thickness greater than the desired thickness of a reflective grid 301 (discussed further below with respect to FIG. 3).

Once the holding layer 303 is in place, the reflective grid 301 may be formed by initially forming openings within the holding layer 303. The openings may be formed using, e.g., a suitable photolithographic masking and etching process. In such a process a second photoresist (not shown in FIG. 3) may be placed on the holding layer 303. The second photoresist may comprise a conventional photoresist material, such as a deep ultra-violet (DUV) photoresist, and may be deposited on the surface of the holding layer 303, for example, by using a spin-on process to place the second photoresist. However, any other suitable material or method of forming or placing the second photoresist may alternatively be utilized. Once the second photoresist has been placed on the holding layer 303, the second photoresist may be exposed to energy, e.g. light, through a patterned reticle in order to induce a reaction in those portions of the second photoresist exposed to the energy. The second photoresist may then be developed, and portions of the second photoresist may be removed, exposing a surface of the holding layer 303 where the reflective grid 301 is desired.

Once the second photoresist is in place, portions of the holding layer 303 may be removed to form the openings and to make room for the reflective grid 301. In an embodiment in which the holding layer 303 is silicon oxide, the removal may be performed using a suitable etching process, such as an anisotropic etch using an etchant such as ammonium fluoride/hydrogen fluoride or ammonium fluoride/acetic acid, although any other suitable removal process may be alternatively utilized. The openings may be formed to have a first width $w_1$ that is greater than a subsequently formed gap 407 (not illustrated in FIG. 3 but illustrated and discussed below with respect to FIG. 4). In an embodiment in which the gap 407 has a second width $w_2$ of about 0.1 µm, the openings may be formed to have a first width $w_1$ of greater than about 0.1 µm, such as 0.15 µm.

Once the openings have been formed, the openings may be filled with reflective material to form the reflective grid 301. In an embodiment the reflective material may be a metal material, such as aluminum (Al), copper (Cu), tantalum (Ta), titanium nitride (TiN) or combinations of these, although any other suitable reflective material may alternatively be utilized. In an embodiment the reflective material may be placed within the openings by first filling and overfilling the openings with the reflective material using a suitable deposition process, such as CVD, PECVD, ALD, electroplating, electroless plating, combinations of these, or the like. Once the reflective material has filled and overfilled the openings, excess amounts of the reflective material outside of the openings may be removed and the reflective material may be planarized with the holding layer 303. In an embodiment the removal and the planarization may be performed using a suitable planarization technique such as chemical mechanical polishing (CMP). The reflective grid 301 may be formed to have a first height $h_1$ of between about 100 Å and about 10000 Å, such as about 4000 Å.

After the reflective grid 301 has been formed within the openings of the holding layer 303, a covering layer 305 may be formed over the reflective grid 301 to encapsulate the reflective grid 301 within the holding layer 303. In an embodiment the covering layer 305 may be a similar material as the holding layer 303 (e.g., a translucent material such as silicon oxide), and may be formed through a deposition process such as CVD, PECVD, combinations of these, or the like. The covering layer 305 may have a thickness of between about 100 Å and about 10000 Å, such as about 6000 Å.

Figure 4:
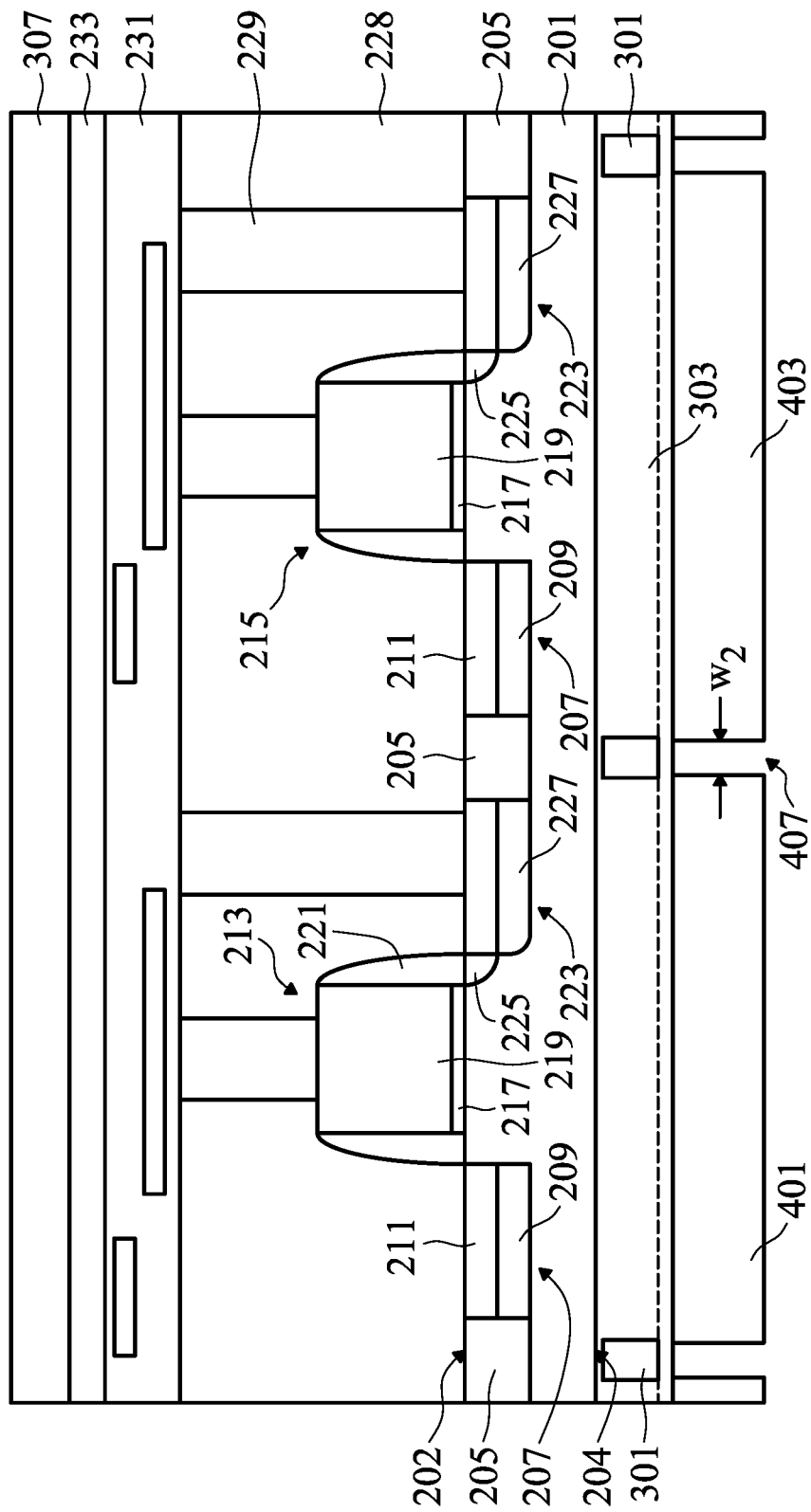
FIG. 4 illustrates a formation of a first color filter and a second color filter with a gap therebetween in accordance with an embodiment.

FIG. 4 illustrates the formation of a first color filter 401 and a second color filter 403 on the back side 204 of the substrate 201 over the reflective grid 301. The first color filter 401 and the second color filter 403 may comprise filters for one of the primary colors (e.g., red, green, blue) and may be positioned to filter the light that will impinge upon the photosensitive diodes 207. The first color filter 401 and the second color filter 403 may be part of an array pattern of color filters, with each color filter being located over a respective one of the pixel regions 101. For example, the first color filter 401 and the second color filter 403 may be part of a Bayer RGB pattern, a Yotsuba CRGB pattern, or any other suitable pattern for the location of color filters over an image sensor 100.

The first color filter 401 and the second color filter 403 may comprise a polymeric material or resin, such as a polymeric polymer, which includes colored pigments. In an embodiment in which a polymeric polymer is utilized to form the first color filter 401, the first color filter 401 may be formed over one photosensitive diode 207 using a process such as spin coating to form a first blanket layer of the first polymeric polymer, although any other suitable method may alternatively be utilized.

Once the first blanket layer of the polymeric polymer has been formed, the first blanket layer may be patterned such that the first color filter 401 is formed over the desired pixel region 101. In an embodiment the first blanket layer may be patterned using a suitable photolithographic masking and etching process, wherein a third photoresist (not illustrated in FIG. 4) is placed, exposed, and developed to cover the desired portions of the first blanket layer. The third photoresist may be similar to the second photoresist described above. Once the desired portions are protected, the exposed portions of the first blanket layer may be removed using, e.g., an anisotropic etch.

The second color filter 403 may be formed to filter light from other pixel regions 101 than the first color filter 401 (such as the adjacent pixel region 101 as illustrated in FIG. 4). In an embodiment the second color filter 403 may be formed by initially spin coating or otherwise placing a second blanket layer (not illustrated in FIG. 4) of the material for the second color filter 403. Once the second blanket layer 403 has been formed, the second blanket layer may be patterned such that the second color filter 403 is formed over the desired pixel region 101. In an embodiment the second blanket layer may be patterned using a suitable photolithographic masking and etching process, wherein a fourth photoresist (not illustrated in FIG. 4) is placed, exposed, and developed to cover the desired portions of the second blanket layer. The fourth photoresist may be similar to the second photoresist described above. Once the desired portions are protected, the exposed portions of the second blanket layer may be removed using, e.g., an anisotropic etch.

FIG. 4 also illustrates the formation of a gap 407 that may be formed between the first color filter 401 and the second color filter 403. The gap 407 may be formed by adjusting the second photoresist and the third photoresist during the patterning of the first color filter 401 and the second color filter 403 so that those portions of the first blanket layer and the second blanket layer that are located where the gap 407 is desired are removed to leave behind the gap 407 (which may be filled with an ambient gas such as air) between the first color filter 401 and second color filter 403. For example, in an embodiment in which the gap 407 may have a second width $w_2$ between about 0.01 μm and about 1 μm, such as about 0.1 μm, the width of the first color filter 401 and the second color filter 403 may each be reduced by 0.05 μm per side such that, together, there is 0.1 μm between them, thereby forming the gap 407 once the first color filter 401 and the second color filter 403 have been patterned.

By placing the gap 407 between the first color filter 401 and the second color filter 403, the gap 407 may be used as a light guide to reflect light passing through either the first color filter 401 or the second color filter 403. While the individual color filters may have similar refractive indexes (such that large angles of injection may put light on a path to cross between the color filters), the inclusion of the gap 407 interrupts this similarity in refractive indexes and helps to reflect the incoming light. By reflecting the incoming light from passing through the gap 407, cross-talk between adjacent pixel regions 101 may be reduced. As such, the overall efficiency of the image sensor 100 may be improved.

Figure 5:
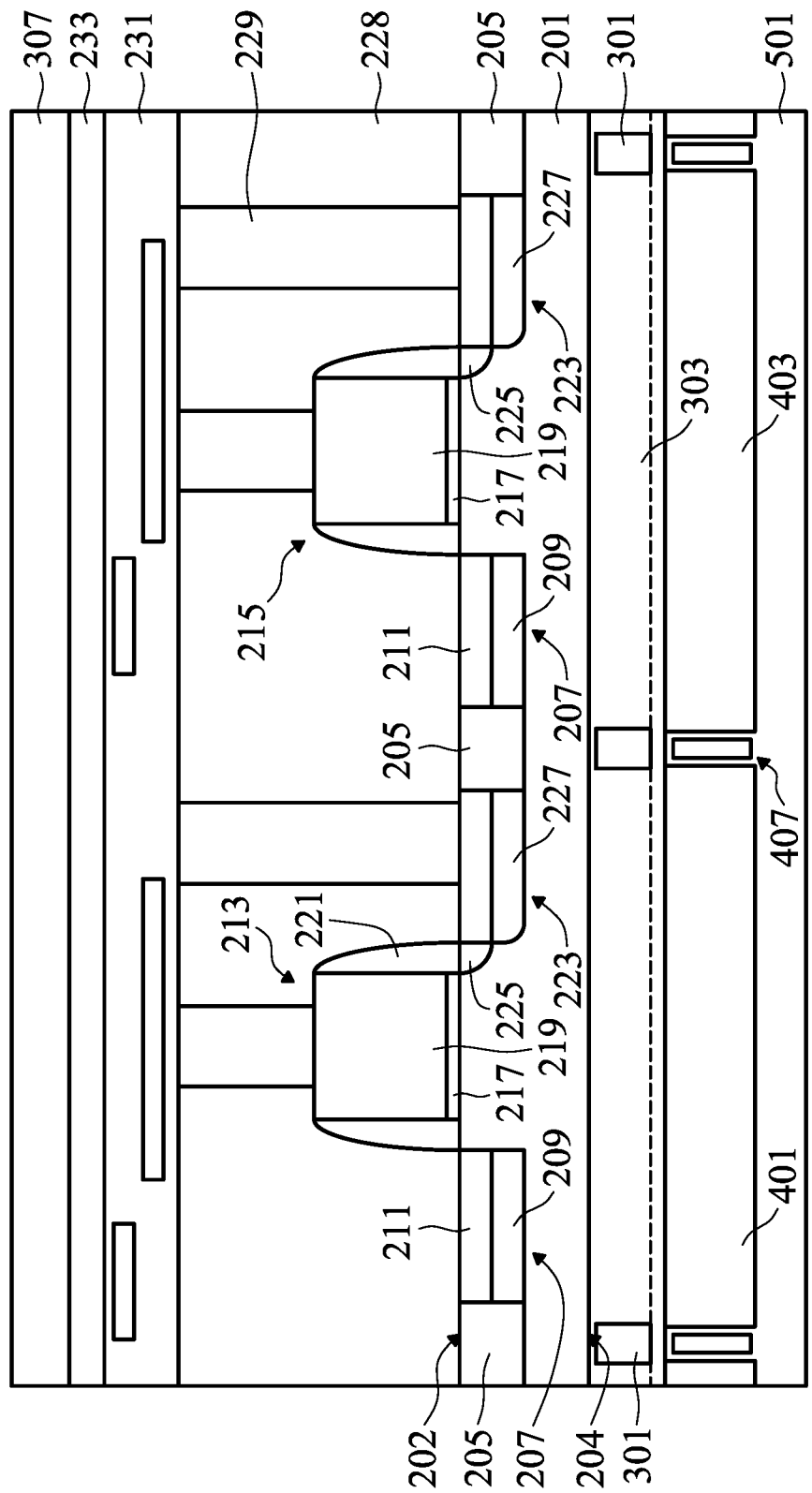
FIG. 5 illustrates a deposition of material over the first color filter and the second color filter in accordance with an embodiment.

FIG. 5 illustrates a formation of a gap covering layer 501 over the first color filter 401 and the second color filter 403 and partially within the gaps 407. In an embodiment the gap covering layer 501 may be a transparent material that allows light to pass through it, and may be, e.g., silicon oxide, although any suitably transparent material may alternatively be utilized. The gap covering layer 501 may be formed using a deposition process such as CVD or PECVD, or the like, and may be formed to a thickness over the first color filter 401 and the second color filter 403 of between about 50 Å and about 5000 Å, such as about 500 Å.

By controlling the deposition process used to form the gap covering layer 501 over the first color filter 401 and the second color filter 403, the material of the gap covering layer 501 (e.g., silicon oxide) will deposit non-conformably within the gap 407 and will build up on the corners of the gap 407 faster than along the sidewalls and the bottom of the gap 407. This process leads to the formation of an overhang and, as the deposition process continues, the overhangs will merge, thereby sealing off the gap 407 with the ambient still inside a part of the gap 407. For example, in an embodiment in which the gap covering layer 501 is silicon oxide deposited by CVD, the CVD process may be performed with precursors such as silane and oxygen at a temperature of between about 50° C. and about 500° C., such as about 200° C., and a pressure of between about 0.1 tor and about 100 torr, such as about 10 torr.

Figure 6:
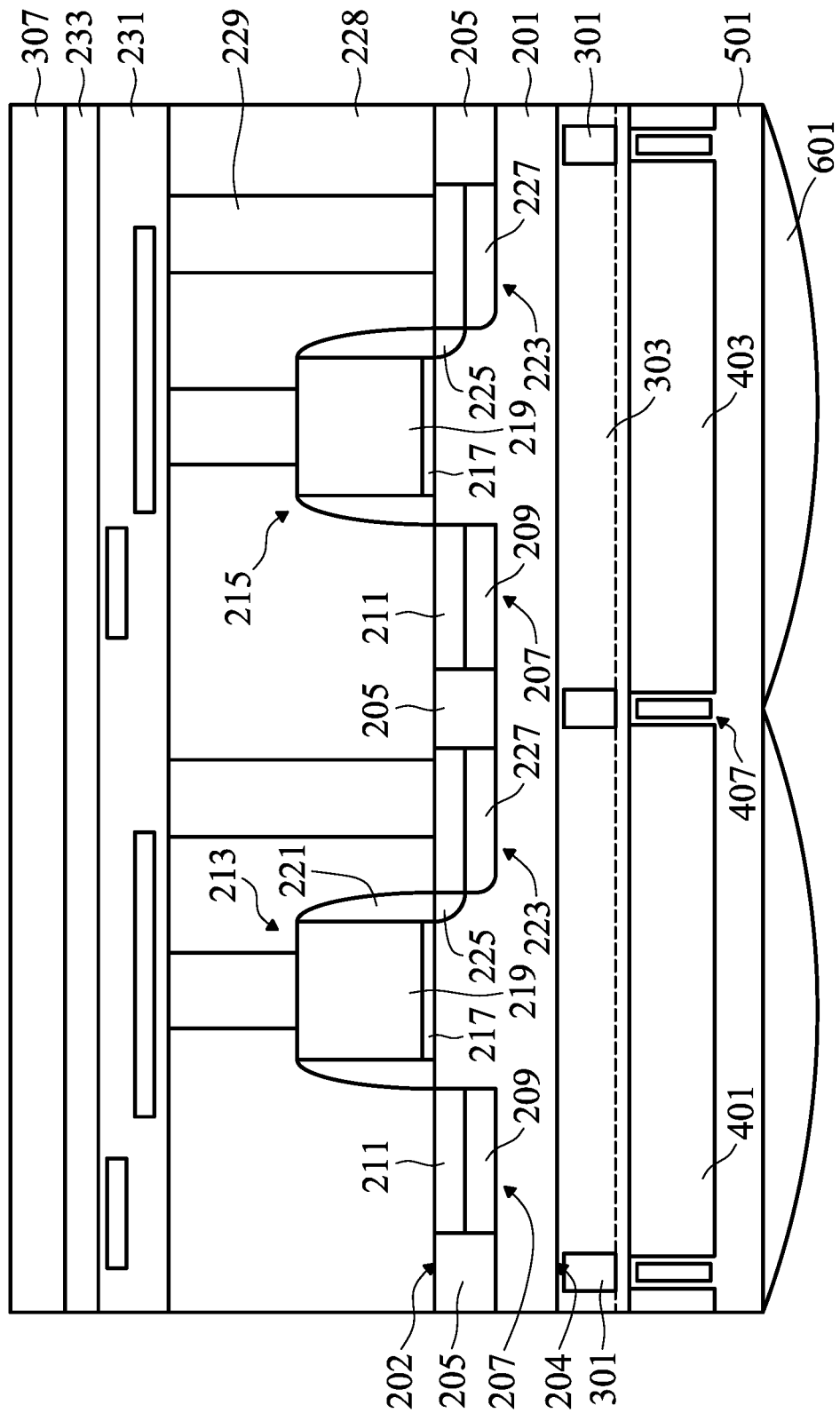
FIG. 6 illustrates a formation of a microlens over the first color filter and the second color filter in accordance with an embodiment.

FIG. 6 illustrates the formation of microlenses 601 over the gap covering layer 501. The microlenses 601 may be formed opposite the gap covering layer 501 from the substrate 201, and may be used to focus impinging light more directly onto the photosensitive diodes 207. The microlenses 601 may be formed by first applying and patterning a positive type photoresist (not shown) over the gap covering layer 501. Once formed, the patterned photoresist may then be baked to round the photoresist into the curved microlenses 601.

By forming the gap 407 between the pixel regions 101 in the image sensor 100, light that impinges on the gap 407 may be reflected back towards the appropriate photosensitive diode 207, making the image sensor 100 more efficient at capturing light and reducing or eliminating cross-talk between different pixel regions 101. With the addition of the reflective grid 301, the reflective grid 301 and the gap 407 will work in conjunction with one another to reflect even more light towards the correct photosensitive diode 207. By ensuring that the light impinges upon the correct photosensitive diode 207, the overall image sensor 100 will be more efficient.

In accordance with an embodiment, a semiconductor device comprising an image sensor comprising a first pixel region and a second pixel region in a substrate, the first pixel region being adjacent to the second pixel region, is provided. A first color filter is over the first pixel region and a second color filter is over the second pixel region. A gap is between the first color filter and the second color filter.

In accordance with another embodiment, a semiconductor device comprising a substrate with a first side and a second side, the substrate comprising a first photosensitive diode and a second photosensitive diode, is provided. A reflective grid is located over the substrate between the first photosensitive diode and the second photosensitive diode, and a first color filter and a second color filter on an opposite side of the reflective grid than the substrate. A gap is over the reflective grid and between the first color filter and the second color filter.

In accordance with yet another embodiment, a method of manufacturing a semiconductor device comprising forming a first photosensitive diode and a second photosensitive diode in a substrate, the first photosensitive diode and the second photosensitive diode being in adjacent pixel regions, is provided. A first color filter blanket layer is formed over the substrate, and a first portion of the first color filter blanket layer is removed to form a first color filter over the first photosensitive diode. A second color filter blanket layer is formed over the substrate, and a second portion of the second color filter blanket layer is removed to form a second color filter over the second photosensitive diode, the removing the first portion and the removing the second portion forming an opening in a region adjacent both the first color filter and the second color filter.

Although the present embodiments and their advantages have been described in detail, it should be understood that various changes, substitutions and alterations can be made herein without departing from the spirit and scope of the embodiments as defined by the appended claims. For example, charge coupled devices (CCD) may be utilized in place of the CMOS devices within the image sensor, and the image sensor may be a front side image sensor instead of a back side image sensor. These devices, steps and materials may be varied while remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A method of manufacturing an image sensor device, the method comprising:

forming a first photosensitive diode and a second photosensitive diode in a substrate, the first photosensitive diode and the second photosensitive diode being in adjacent pixel regions;

forming a first color filter blanket layer over the substrate;

removing a first portion of the first color filter blanket layer to form a first color filter over the first photosensitive diode;

forming a second color filter blanket layer over the substrate;

removing a second portion of the second color filter blanket layer to form a second color filter over the second photosensitive diode, the removing the first portion and the removing the second portion forming an opening adjacent both the first color filter and the second color filter; and depositing a gap material over the first color filter and the second color, filter and at least partially lining sidewalls and a bottom of the opening, wherein the depositing the gap material encapsulates a void within the opening.

2. The method of claim 1, wherein the depositing the gap material comprises depositing an oxide.

3. The method of claim 1, wherein the depositing the gap material comprises using at least in part a non-conformal deposition process.

4. The method of claim 1, further comprising forming a reflective grid over the substrate prior to the forming the first color filter blanket layer.

5. The method of claim 4, wherein the forming the reflective grid further comprises:
depositing a translucent material over the substrate;
patterning the translucent material to form openings within the translucent material; and
filling the openings with a reflective material.

6. The method of claim 5, wherein the filling the openings with a reflective material comprises filling the openings with a metal.

7. The method of claim 1, wherein the removing the first portion of the first color filter blanket layer further comprises:
placing a first photoresist over the first color filter blanket layer;
patterning the first photoresist to expose the first portion of the first color filter blanket layer; and
removing the first portion of the first color filter blanket layer.

8. A method of manufacturing a semiconductor device, the method comprising:
forming a first color filter over a first photosensitive diode and a second color filter over a second photosensitive diode, wherein the first photosensitive diode and the second photosensitive diode are located within a substrate; and
placing a gap covering layer within a space between the first color filter and the second color filter, wherein the gap covering layer covers a sidewall of the first color filter from a top of the first color filter to a bottom of the first color filter and wherein the gap covering layer encapsulates a first region, the first region being void of solid material.

9. The method of claim 8, wherein the placing the gap covering layer comprises placing an oxide.

10. The method of claim 8, further comprising forming a reflective grid over the substrate prior to the forming the first color filter.

11. The method of claim 10, wherein the forming the reflective grid further comprises:
depositing a dielectric material;
forming an opening in the dielectric material; and
filling the opening with a reflective material.

12. The method of claim 11, further comprising depositing a covering layer over the reflective material prior to the forming the first color filter.

13. The method of claim 8, further comprising thinning the substrate prior to the forming the first color filter.

14. The method of claim 8, wherein the placing the gap covering layer within the space between the first color filter and the second color filter comprises depositing the gap covering layer with a non-conformal deposition process.

15. A method of manufacturing a semiconductor device, the method comprising:
manufacturing a first photosensitive diode within a substrate;
manufacturing a second photosensitive diode within the substrate adjacent to the first photosensitive diode;
forming a first color filter layer over the first photosensitive diode and the second photosensitive diode;
removing a first portion of the first color filter layer from over the second photosensitive diode to form a first color filter;
forming a second color filter layer over the first photosensitive diode and over the second photosensitive diode;
removing a second portion of the second color filter layer to form a second color filter over the second photosensitive diode, wherein the removing the second portion of the second color filter layer exposes a first surface of the first color filter, the first surface facing the second color filter; and
depositing a gap covering material to extend a height of the first color filter, wherein the depositing the gap covering material has a constant composition and forms a void between the first color filter and the second color filter, the void being devoid of solid material.

16. The method of claim 15, further comprising grinding the substrate on an opposite side of the substrate from the first photosensitive diode.

17. The method of claim 15, further comprising forming a reflective grid over the substrate prior to the forming the first color filter.

18. The method of claim 17, wherein the forming the reflective grid further comprises:
depositing a translucent material;
patterning a grid opening within the translucent material; and
filling the grid opening with a reflective material.

19. The method of claim 18, further comprising depositing a covering layer over the reflective material prior to the forming the first color filter.

20. The method of claim 18, wherein the depositing the gap covering material is performed at least in part with a non-conformal deposition process.

* * * * *